(12) United States Patent
Wang et al.

(10) Patent No.: US 9,780,291 B2
(45) Date of Patent: Oct. 3, 2017

(54) SELF-CHARGING ENERGY STORAGE SYSTEM

(75) Inventors: Zhong L. Wang, Marietta, GA (US); Xinyu Xue, Atlanta, GA (US); Yan Zhang, Atlanta, GA (US); Sihong Wang, Atlanta, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 43 days.

(21) Appl. No.: 14/344,179

(22) PCT Filed: Sep. 13, 2012

(86) PCT No.: PCT/US2012/055026
§ 371 (c)(1),
(2), (4) Date: Mar. 11, 2014

(87) PCT Pub. No.: WO2013/040137
PCT Pub. Date: Mar. 21, 2013

(65) Prior Publication Data
US 2014/0342192 A1   Nov. 20, 2014

Related U.S. Application Data

(60) Provisional application No. 61/534,036, filed on Sep. 13, 2011, provisional application No. 61/534,043, (Continued)

(51) Int. Cl.
*H01M 14/00* (2006.01)
*H01L 41/113* (2006.01)
(Continued)

(52) U.S. Cl.
CPC ............ *H01L 41/113* (2013.01); *H01G 11/06* (2013.01); *H01G 11/58* (2013.01); *H01M 4/505* (2013.01);
(Continued)

(58) Field of Classification Search
CPC .. H01M 4/505; H01M 4/525; H01M 10/0525; H01M 10/425; H01M 10/46;
(Continued)

(56) References Cited

U.S. PATENT DOCUMENTS 5,378,551 A   1/1995   Meadows et al.
6,327,760 B1 *  12/2001   Yun ..................... H01L 41/0973
29/25.35

(Continued)

FOREIGN PATENT DOCUMENTS

WO       WO02055766 A1     7/2002

OTHER PUBLICATIONS

WIPO: "Notification of Transmittal of the International Search Report and Written Opinion of the International Searching Authority, or the Declaration"; dated Nov. 26, 2012.
(Continued)

*Primary Examiner* — Raymond Alejandro
(74) *Attorney, Agent, or Firm* — Bryan W. Bockhop; Bockhop Intellectual Property Law, LLC

(57) ABSTRACT

A self-charging power pack (300) includes a cathode (312) and an anode (310) that is spaced apart from the cathode (312). An electrolyte (318) is disposed between the anode (310) and the cathode (312). A piezoelectric ion transport layer (322) is disposed between the anode (310) and the cathode (312). The piezoelectric ion transport layer (322) has a piezoelectric property that generates a piezoelectric field when a mechanical force is applied thereto. The piezoelectric field causes transportation of ions in the electrolyte (318) through the piezoelectric ion transport layer (322) towards the anode (310).

14 Claims, 4 Drawing Sheets

Related U.S. Application Data filed on Sep. 13, 2011, provisional application No. 61/534,071, filed on Sep. 13, 2011.

(51) Int. Cl.

| | | |
|---|---|---|
| *H01M 4/505* | (2010.01) | |
| *H01M 4/525* | (2010.01) | |
| *H01G 11/06* | (2013.01) | |
| *H01G 11/58* | (2013.01) | |
| *H01M 10/0525* | (2010.01) | |
| *H01M 10/42* | (2006.01) | |
| *H01M 10/46* | (2006.01) | |
| *H01M 10/0568* | (2010.01) | |
| *H01M 10/0569* | (2010.01) | |

(52) U.S. Cl.
CPC ....... *H01M 4/525* (2013.01); *H01M 10/0525* (2013.01); *H01M 10/425* (2013.01); *H01M 10/46* (2013.01); *H01M 14/00* (2013.01); *H01M 10/0568* (2013.01); *H01M 10/0569* (2013.01)

(58) Field of Classification Search
CPC . H01M 10/0568; H01M 14/00; H01L 41/113; H01G 11/06; H01G 11/58; Y02E 60/122
See application file for complete search history.

(56) References Cited

U.S. PATENT DOCUMENTS

| | | | |
|---|---|---|---|
| 6,586,095 | B2 | 7/2003 | Wang et al. |
| 7,220,310 | B2 | 5/2007 | Wang et al. |
| 7,351,607 | B2 | 4/2008 | Wang et al. |
| 7,705,523 | B2 | 4/2010 | Wang et al. |
| 7,898,156 | B2 | 3/2011 | Wang et al. |
| 2002/0142202 | A1 | 10/2002 | Li et al. |
| 2003/0205657 | A1 | 11/2003 | Voisin |
| 2004/0101755 | A1* | 5/2004 | Huang ................ H01M 4/131 429/231.1 |
| 2004/0127025 | A1 | 7/2004 | Crocker, Jr. et al. |
| 2005/0188751 | A1 | 9/2005 | Puskas |
| 2005/0242366 | A1 | 11/2005 | Parikh et al. |
| 2006/0286456 | A1* | 12/2006 | Fu ........................ H01M 2/166 429/231.1 |
| 2007/0190422 | A1 | 8/2007 | Morris |
| 2008/0067618 | A1 | 3/2008 | Wang et al. |
| 2008/0089012 | A1 | 4/2008 | Kon et al. |
| 2008/0305386 | A1 | 12/2008 | Havel et al. |
| 2009/0042102 | A1 | 2/2009 | Cui et al. |
| 2009/0066195 | A1 | 3/2009 | Wang et al. |
| 2009/0115293 | A1 | 5/2009 | Wang et al. |
| 2009/0179523 | A1 | 7/2009 | Wang et al. |
| 2009/0209303 | A1 | 8/2009 | Kroll et al. |
| 2010/0007248 | A1 | 1/2010 | Chiang et al. |
| 2010/0026142 | A1 | 2/2010 | Jones et al. |
| 2010/0117488 | A1 | 5/2010 | Wang et al. |
| 2010/0139750 | A1 | 6/2010 | Kim et al. |
| 2010/0141095 | A1 | 6/2010 | Park |
| 2010/0147371 | A1 | 6/2010 | Cho |
| 2010/0171095 | A1 | 7/2010 | Wang et al. |
| 2010/0191153 | A1 | 7/2010 | Sanders et al. |
| 2010/0220428 | A1 | 9/2010 | Shirakawa et al. |
| 2010/0253184 | A1 | 10/2010 | Choi et al. |
| 2010/0258160 | A1 | 10/2010 | Wang et al. |
| 2010/0314968 | A1 | 12/2010 | Mohamadi |
| 2011/0000060 | A1 | 1/2011 | Lee et al. |
| 2011/0013340 | A1 | 1/2011 | Horiuchi et al. |
| 2011/0050042 | A1 | 3/2011 | Choi et al. |
| 2011/0107569 | A1 | 5/2011 | Wang et al. |
| 2011/0143196 | A1* | 6/2011 | Okumura .......... H01M 10/0569 429/203 |
| 2013/0154441 | A1* | 6/2013 | Redmond ................ G08G 1/02 310/319 |

OTHER PUBLICATIONS

Jeon et al., "MEMS power generator with transverse mode thin film PCT," Science Direct, vol. 122, Issue 1, Jul. 29, 2005, pp. 16-22.

Gao et al., Nanoarchitectures of semiconducting and piezoelectric zinc oxide, J. Applied Physics 97, 044304 (2005).

Wang et al., "Large-Size Liftable Inverted-Nanobowl Sheets as Reusable Masks for Nanolithography," Nano Letters, vol. 5, No. 9, 2005, 1748-1788.

Lao et al., "Formation of double-side teethed nanocombs of ZnO and self-catalysis of Zn-terminated polar surface," Chemical Physics Letters, Elsevier B.V., 2005.

Wang et al., "Piezoelectric Nanogenerators Based on Zinc Oxide Nanowire Arrays," Science, vol. 312, pp. 242-245, Apr. 14, 2006.

* cited by examiner

SELF-CHARGING ENERGY STORAGE SYSTEM

CROSS-REFERENCE TO RELATED APPLICATION(S)

This application claims the benefit of U.S. Provisional Patent Application Ser. No. 61/534,036, filed Sep. 3, 2011. This application also claims the benefit of U.S. Provisional Patent Application Ser. No. 61/534,043, filed Sep. 13, 2011. This application also claims the benefit of U.S. Provisional Patent Application Ser. No. 61/534,071, filed Sep. 13, 2011, the entirety of each of which is hereby incorporated herein by reference.

BACKGROUND OF THE INVENTION

1. Field of the Invention

The present invention relates to energy storage systems and, more specifically, to a self-charging energy storage system.

2. Description of the Related Art

Common electrical energy storage systems include electrochemical storage systems (such as lithium ion batteries and the like) and capacitors. Batteries are the most widely used electrical energy storage systems as they have a relatively high energy density. Therefore, they are relatively compact.

Most conventional electrical energy storage systems are recharged using external sources of electricity. For example, battery rechargers usually employ a rectifying circuit to convert alternating current to direct current, which is applied to a discharged battery in a predetermined manner. The application of an electrical voltage to the battery reverses the electrochemical process that occurred during the discharge of the battery.

In certain applications, use of an external charging circuit is not practical or desirable. For example, recharging a battery in some biomedical applications can be difficult. Also, in remote sensing and space-based applications, battery recharging can be difficult or even impossible.

Several attempts have been made at recharging batteries using conversion of mechanical energy to electrical energy. For example, some battery rechargers employ a spring-driven generator that, once released, generates a charge that can recharge a battery. However, such attempts generally require an individual to provide the mechanical energy intentionally to the recharger and they tend to produce only a limited amount of energy.

Therefore, there is a need for a system that self-charges an energy storage system.

SUMMARY OF THE INVENTION

The disadvantages of the prior art are overcome by the present invention which, in one aspect, is a self-charging power pack that includes a cathode and an anode that is spaced apart from the cathode. An electrolyte is disposed between the anode and the cathode. A piezoelectric ion transport layer is disposed between the anode and the cathode. The piezoelectric ion transport layer has a piezoelectric property that generates a piezoelectric field when a mechanical force is applied thereto. The piezoelectric field causes transportation of ions in the electrolyte through the piezoelectric ion transport layer towards the anode.

In another aspect, the invention is a self-charging battery that includes a lithium compound cathode, including a metal foil layer and a $LiCoO_2$ layer disposed adjacent thereto. An anode spaced is apart from the lithium compound cathode. A plurality of elongated nanostructures extends upwardly from anode. An electrolyte that includes $LiPF_6$ is disposed between the anode and the cathode. An aligned PVDF polar polymer piezoelectric ion transport layer is disposed between the anode and the cathode. The piezoelectric ion transport layer has a piezoelectric property that generates a piezoelectric field when a mechanical force is applied thereto, thereby causing transportation of lithium ions in the electrolyte through the piezoelectric ion transport layer towards the anode.

In yet another aspect, the invention is a self-charging super capacitor that includes a cathode including a metal foam. An anode is spaced apart from the cathode and includes a metal foam. An electrolyte, which includes potassium hydroxide, is disposed between the anode and the cathode. A piezoelectric ion transport layer is disposed between the anode and the cathode. The piezoelectric ion transport layer has a piezoelectric property that generates a piezoelectric field when a mechanical force is applied thereto. The piezoelectric field causes transportation of hydroxide ions in the electrolyte through the piezoelectric ion transport layer towards the anode.

These and other aspects of the invention will become apparent from the following description of the preferred embodiments taken in conjunction with the following drawings. As would be obvious to one skilled in the art, many variations and modifications of the invention may be effected without departing from the spirit and scope of the novel concepts of the disclosure.

DETAILED DESCRIPTION OF THE INVENTION

Figure 1A:
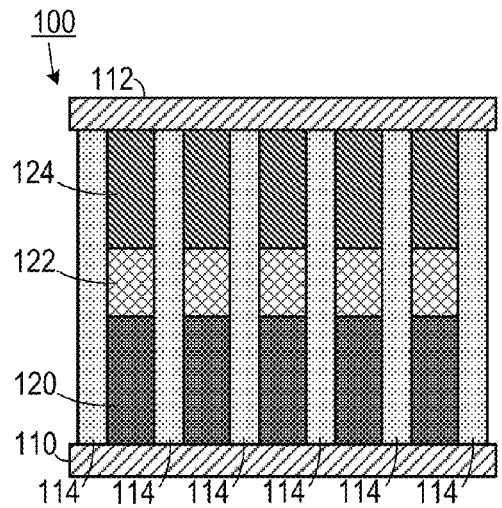
FIGS. 1A and 1B are side elevational schematic views of one embodiment of a power pack.

A preferred embodiment of the invention is now described in detail. Referring to the drawings, like numbers indicate like parts throughout the views. Unless otherwise specifically indicated in the disclosure that follows, the drawings are not necessarily drawn to scale. As used in the description herein and throughout the claims, the following terms take the meanings explicitly associated herein, unless the context clearly dictates otherwise: the meaning of "a," "an," and "the" includes plural reference, the meaning of "in" includes "in" and "on."

Figure 1B:
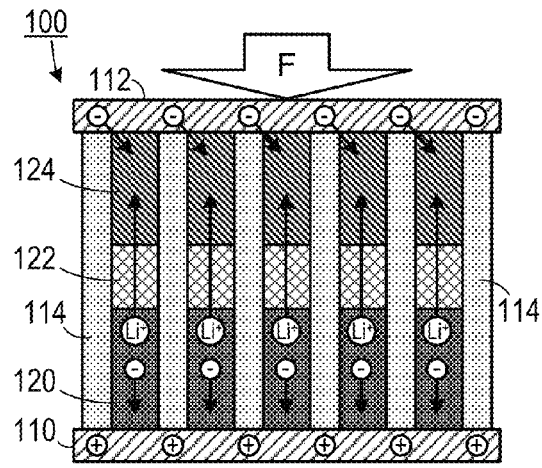

As shown in FIGS. 1A and 1B, one simple embodiment of a self-charging power pack is embodied as a lithium ion battery 100, that includes a anode, which in this embodiment, includes a metal foil 112 and a positive electrode material 124 (which includes a lithium compound such as $LiMn_2O_4$ or $LiCoO_2$) and an cathode, which in this embodiment, includes a metal foil 112 and a negative electrode material 120 that is separated from the positive electrode material 124 by a polymer separator 122 that includes an electrolyte. A plurality of piezoelectric nanostructures 114 is disposed between metal foil 110 and metal foil 112. The polymer separator 122 acts as piezoelectric ion transport layer. The plurality of piezoelectric nanostructures 114 generates a piezoelectric field when a mechanical force is applied thereto (as in direction F). This causes transportation of lithium ions in the electrolyte through the piezoelectric ion transport layer towards the anode. This results in the conversion of mechanical energy to chemical energy in the battery.

Figure 2A:
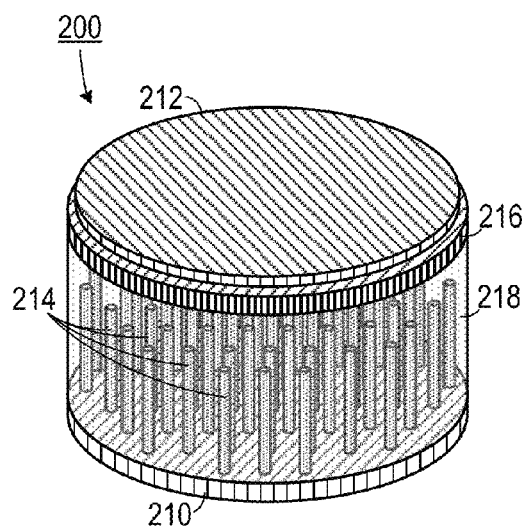
FIGS. 2A and 2B are a top front perspective schematic view and a side elevational schematic view, respectively, of one embodiment of a battery.
Figure 2B:
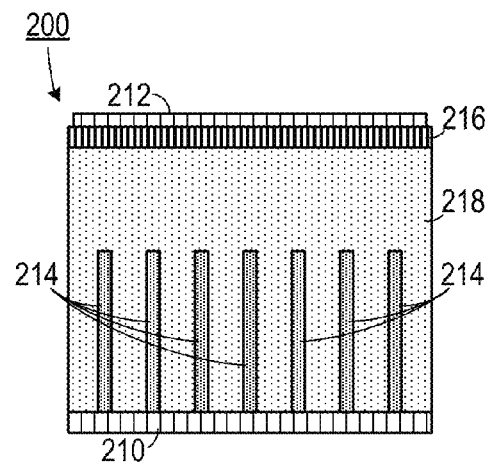

As shown in FIGS. 2A and 2B, in another embodiment of a battery, a copper anode foil layer 210 has a plurality of silicon nanowires 214 extending upwardly therefrom. A cathode that includes an aluminum foil layer 212 and a $LiCoO_2$ layer 216 is separated from the anode foil layer 210 by a piezoelectric ion transport layer 218. The piezoelectric ion transport layer 218 includes a polymer such as poly (vinylidene fluoride) (PVDF) that has been polarized and oriented during manufacture. (One source of suitable polarized PVDF is Measurement Specialties, Inc., 1000 Lucas Way, Hampton, Va. 23666.) The PVDF generates a piezoelectric field when force is applied thereto, causing lithium ions to migrate to the anode foil layer 210. In this embodiment, the nanowires 214 add surface area to the anode foil layer 210 interface with the ion transport layer 218 thereby increasing the lithium ions that have been transported thereto.

Figure 3A:
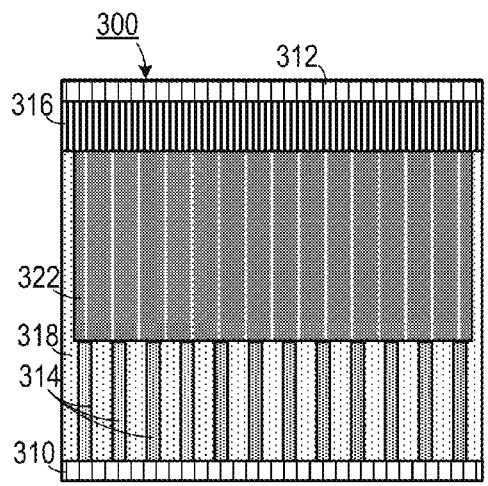
FIGS. 3A-3D are schematic diagrams of an embodiment of a battery showing a recharging process.
Figure 3B:
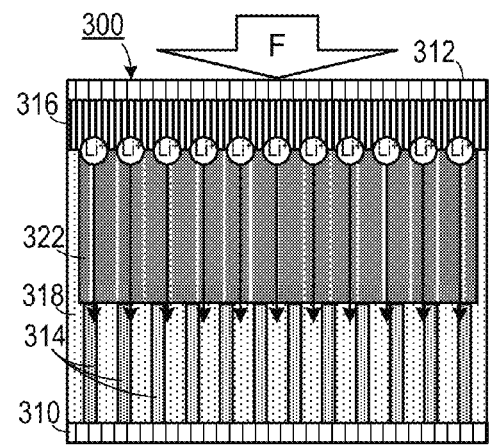
Figure 3C:
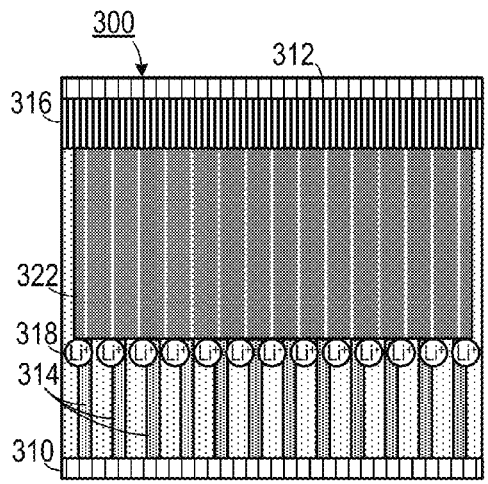
Figure 3D:
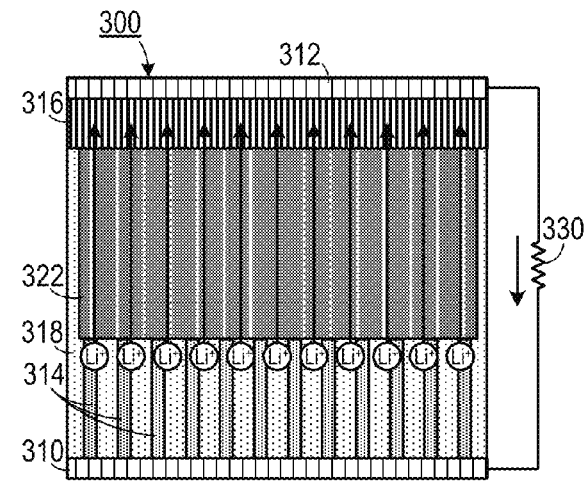

As shown in FIGS. 3A-3D, one embodiment of a self-charging battery 300 includes a cathode with an aluminum foil layer 312 coupled to a lithium compound layer 316 (which could include, for example $LiCoO_2$), a PVDF piezoelectric ion transport layer 322, an anode that includes a titanium foil layer 310 with a plurality of elongated $TiO_2$ nanotubes 314 extending upwardly therefrom. (While shown as being discreet nanotubes in FIGS. 3A-3D for simplicity, in one embodiment, the nanotubes are densely packed, as shown in the micrograph 500 of FIG. 5.) An electrolyte 318, which can include $LiPF_6$, is disposed between the cathode and the anode. When a force is applied (such as in direction F), as shown in FIG. 3B, then the piezoelectric ion transport layer 322 generates a piezoelectric field which induces lithium ions ($Li^+$) to diffuse toward the $TiO_2$ nanotubes 314. When the force is removed, as shown in FIG. 3C, the lithium ions tend to remain in place. When a load 330 is applied between the cathode foil layer 312 and the anode foil layer 310, as shown in FIG. 3D, the lithium ions tend to diffuse back to the lithium compound layer 316 as current moves through the load.

The nanotubes 314 of the anode have a surface with a first nano-scale texture that is complemented by the surface of the piezoelectric ion transport layer 322 so that an increased surface area exists at the interface, thereby increasing recharging efficiency. Other nanostructures, such as conductive nanoparticles, conductive nanotubes, or a composite of nanostructures could be employed in the anode.

Energy generation and energy storage are two distinct processes that are usually accomplished using two separated units designed based on different physical principles, such as piezoelectric nanogenerator and Li-ion battery; the former converts mechanical energy into electricity, and the latter stores electric energy as chemical energy. The present invention employs a mechanism that directly hybridizes the two processes into one, in which mechanical energy is directly converted and simultaneously stored as chemical energy without going through the intermediate step of first converting into electricity.

Figure 5:
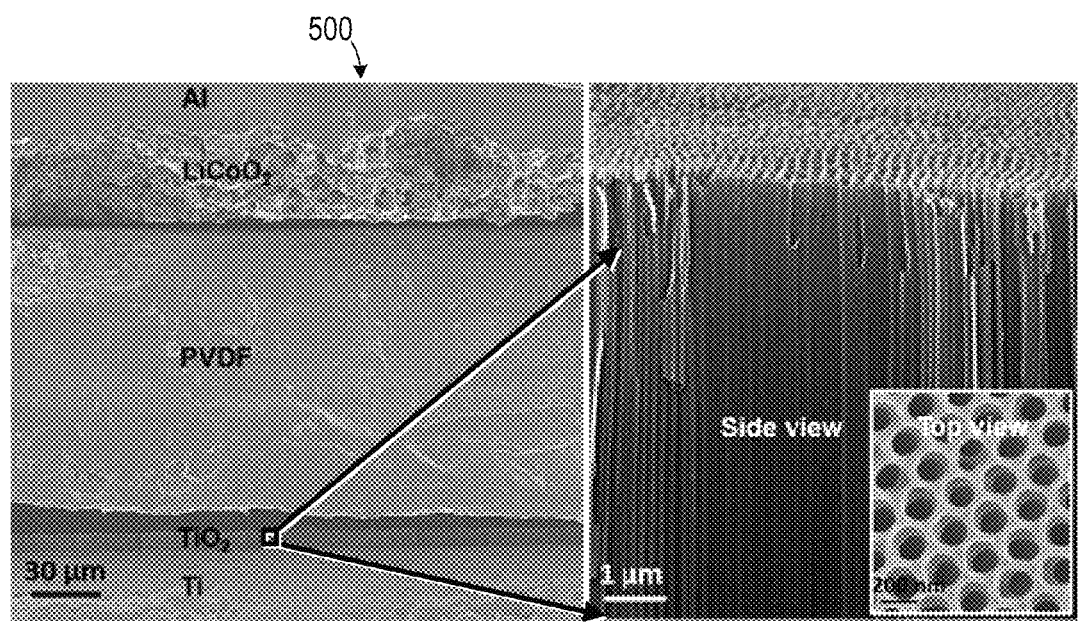
FIG. 5 is a micrograph of one embodiment of a battery.

One experimental embodiment of a self-charging process is based on the characteristics of both piezoelectric and electrochemical properties, as schematically shown in FIGS. 3A-3D, is based on a sealed stainless-steel 2016-coin-type cell. The anode employed aligned $TiO_2$ nanotube (NT) arrays 314 that were directly grown on a Ti foil 310. A layer of polarized poly(vinylidene fluoride) (PVDF) film 322 was placed above the $TiO_2$ nanotube arrays 314 as a separator. This PVDF film 322 can establish a piezoelectric potential across its thickness under externally applied stress, which not only converts mechanical energy into electricity, but also serves as the driving force for the migration of Li ions. The cathodes are $LiCoO_2$/conductive carbon/binder mixtures on aluminum foils. A cross-sectional scanning electron microscopy (SEM) image of the sandwich structure of the device 500 is shown in FIG. 5. Returning to FIGS. 3A-3D, in the experimental embodiment, the $TiO_2$ nanotube arrays 314 with an anatase crystal structure were fabricated on Ti substrate using an anodization method with a post-annealing process in air. The height and diameter of the nanotubes 314 were about 20 μm and 100 nm, respectively. A commercial piezoelectric PVDF film 322 with a thickness of ~110 μm was predominantly composed of β phase, which generates the strong piezoelectric effect, and with a small fraction of α phase. The PVDF film 322 had been prior poled before assembly into the battery 300. After placing $LiCoO_2$ cathode 316 with a thickness of 20 μm on the other side, the system was filled with electrolyte 318 (1M $LiPF_6$ in 1:1 ethylene carbonate: dimethyl carbonate), the system was sealed. The galvanostatic charge-discharge measurements, with comparison to traditional Li-ion batteries using PE as separators, proved that the power cells act also as a battery system. Periodic deformations were applied onto the device in order to charge it up and the voltage and current were monitored simultaneously in both charging and discharging processes.

The working mechanism of the self-charging power cell is an electrochemical process driven by deformation created piezoelectric potential. At the beginning, the device is at a discharged state, with $LiCoO_2$ as the positive electrode (cathode) material and $TiO_2$ NTs as the negative electrode (anode), which is the originally fabricated structure of the device, and the $LiPF_6$ electrolyte is evenly distributed across the entire space. A PVDF film, which has intimate contacts with both electrodes, serves as the separator and it has the smallest Young's modules among all of the components in the device [PVDF in electrolyte solvent: ~1.2 GPa; $TiO_2$: 100 GPa ($Y_a$) and 266 GPa ($Y_c$); $LiCoO_2$: ~70 GPa; Ti Foil: 100-110 GPa; Al Foil: 69 GPa], thus, it experiences the most compressive strain when a compressive stress is applied onto the device. A PVDF film was used with a polarity that results in a positive piezoelectric potential (piezopotential) at the cathode ($LiCoO_2$) side and negative piezopotential at the anode ($TiO_2$) under compressive strain for separating the charges. Under the driving of the piezoelectric field with a direction from the cathode to the anode, the Li ions in the electrolyte will migrate along the direction through the ionic conduction paths present in the PVDF film separator for ion conduction in order to screen the piezoelectric field, and finally reach the anode (Note: a PVDF film is an ionic conductor for $Li^+$, which is why that PVDF is used as the base for polymer electrolyte and also the binder for electrodes in Li-ion batteries). The decreased concentration of $Li^+$ at the cathode will break the chemical equilibrium of the cathode electrode reaction ($LiCoO_2 \leftrightarrow Li_{1-x}CoO_2 + xLi^+ +$ xe$^-$), so that Li$^+$ will deintercalate from LiCoO$_2$, turning it into Li$_{1-x}$CoO$_2$ and leaving free electrons at the current collector (Al foil) of the cathode electrode. This process is driven by the tendency of establishing new chemical equilibrium. In the meanwhile, under the elevated concentration of Li$^+$ at the anode, the reaction at the other electrode (TiO$_2$+xLi$^+$+xe$^-$ ↔ Li$_x$TiO$_2$) will move to the forward direction for the same reason, enabling Li$^+$ to react with TiO$_2$ so that Li$_x$TiO$_2$ will be produced at the anode electrode, leaving the positive charges at the Ti foil as the current collector. During this process, Li$^+$ will continuously migrate from the cathode to the anode and the device is charged up a little bit owing to the large volume of the device.

During the progress of charging electrochemical reactions at the two electrodes, extra free electrons will transfer from the cathode to the anode, in order to maintain the charge neutrality and the continuity of the charging reaction. There are generally two ways for the electrons to transfer: either inside the battery system in some manner, or through the external circuitry.

Under the mechanical deformation, the piezopotential continues to drive the migration of Li$^+$ ions until to a point when the chemical equilibriums of the two electrodes are re-established and the distribution of the Li$^+$ can balance the piezoelectric-field in the PVDF film, with no Li$^+$ drifting through PVDF; thus, a new equilibrium is achieved and self-charging process will cease. This is the process of converting mechanical energy directly into chemical energy.

When the applied force is released, the piezoelectric field of the PVDF disappears, which breaks the electrostatic equilibrium, so that a portion of the Li ions diffuse back from the anode to the cathode and reach an even distribution of Li$^+$ all over the space in the device again. Then, a cycle of charging is completed through an electrochemical process of oxidizing a small amount of LiCoO$_2$ at cathode to Li$_{1-x}$CoO$_2$ and reducing a bit of TiO$_2$ to Li$_x$TiO$_2$ at the anode. When the device is mechanically deformed again, the process presented above is repeated, resulting in another cycle of charging by converting mechanical energy directly into chemical energy.

In this self-charging mechanism, the role played by the piezoelectric material (PVDF) is somewhat similar to the DC power supply used in the conventional charging process of a Li battery. Both of them can be deemed as charge pumps, but the specific mechanisms are different. As for the conventional charging method, the DC power supply will pump the electrons from the positive electrode to the negative electrode through the external circuit and the Li ions will go in the same direction but within the cell, in order to remain a neutral charge balance. Thus the electrochemical reactions on the two electrodes occur and the battery is charged up. In the present invention, the piezoelectric material pumps the Li$^+$ ions, rather than the electrons, from the positive to the negative electrode, which also accomplishes the charging of the device. This mechanism can also be explained by thermodynamics. According to Nernst's theory, the relative electrode potentials of the two electrodes have the following relationships with Li$^+$ concentration:

$$\varphi_{Li_{1-x}CoO_2/LiCoO_2} = \varphi^o_{Li_{1-x}CoO_2/LiCoO_2} - \frac{RT}{F}\ln\frac{1}{[a_c(Li^+)]^x}$$

$$\varphi_{TiO_2/Li_xTiO_2} = \varphi^o_{TiO_2/Li_xTiO_2} - \frac{RT}{F}\ln\frac{1}{[a_a(Li^+)]^x}$$

where $\varphi_{Li_{1-x}CoO_2/LiCoO_2}$ and $\varphi_{TiO_2/Li_xTiO_2}$ are actual electrode potentials of cathode and anode, $\varphi^o_{Li_{1-x}CoO_2/LiCoO_2}$ and $\varphi^o_{TiO_2/Li_xTiO_2}$ are standard electrode potentials of these two electrodes, and a$_c$(Li$^+$) and a$_a$(Li$^+$) are the activities of Li$^+$ around cathode and anode, respectively, which can be approximately equated to the concentrations, R is the gas constant, T is the temperature, and F is the Faraday constant. Thus, under the driving of piezoelectric field, because of depleting of Li$^+$ concentration near the positive electrode, the electrode potential $\varphi_{Li_{1-x}CoO_2/LiCoO_2}$ will decrease; likewise, the elevation of Li$^+$ concentration will result in an increase of of $\varphi_{TiO_2/Li_xTiO_2}$ at the negative electrode. For a conventional Li-ion battery, the electrode potential $\varphi_{Li_{1-x}CoO_2/LiCoO_2}$ is larger than $\varphi_{TiO_2/Li_xTiO_2}$, so that the battery can discharge spontaneously through the reduction of Li$_{1-x}$CoO$_2$ and oxidization of Li$_x$TiO$_2$. But for the self-charging process, because the change of Li$^+$ concentration will possibly make $\varphi_{TiO_2/Li_xTiO_2}$ larger than $\varphi_{Li_{1-x}CoO_2/LiCoO_2}$, the device is self-charged through the reduction of TiO$_2$ and oxidization of LiCoO$_2$.

In the experimental embodiment, the TiO$_2$ nanotube arrays were directly grown on Ti foils (0.05 mm thick, 99.6% purity; Alfa Aesar) by electrochemical anodizing in ethylene glycol solution containing 0.3 wt % NH$_4$F and 2 vol % H$_2$O, with Pt as counter electrode. Prior to growth, all Ti foils were ultrasonically cleaned in acetone, water, and ethanol consecutively, and then dried in air. A thin layer of PMMA was spin-coated on one side of the foil to protect it from the etching solution. The prepared Ti foil was anodized at 50 V for 5 hours, and then treated by ultrasonication in acetone for a few seconds, leaving hexagon-like footprints on the surface of Ti foil. A second anodization was then performed under the same condition for 2 h to produce well-aligned TiO$_2$. Finally, the two-step anodized nanotubes were annealed at 450° C. for 2 hours in the air to form anatase crystalline phase and remove PMMA on the back of Ti foils.

Figure 4A:
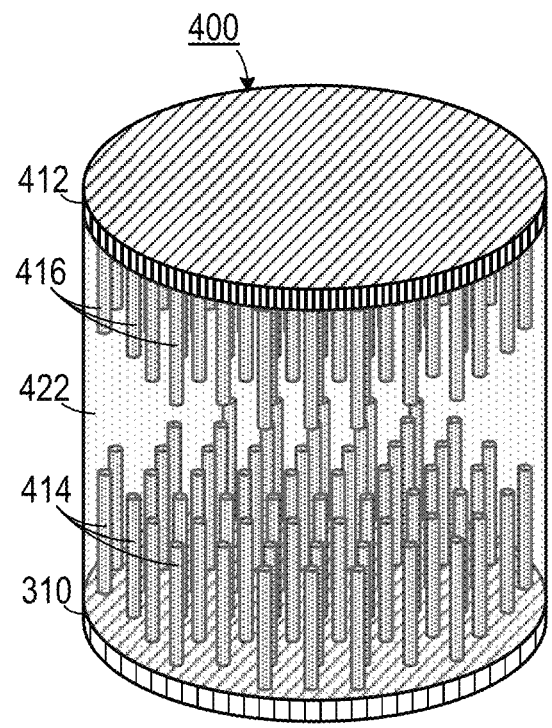
FIGS. 4A and 4B are a top front perspective schematic view and a side elevational schematic view, respectively, of one embodiment of a super capacitor.
Figure 4B:
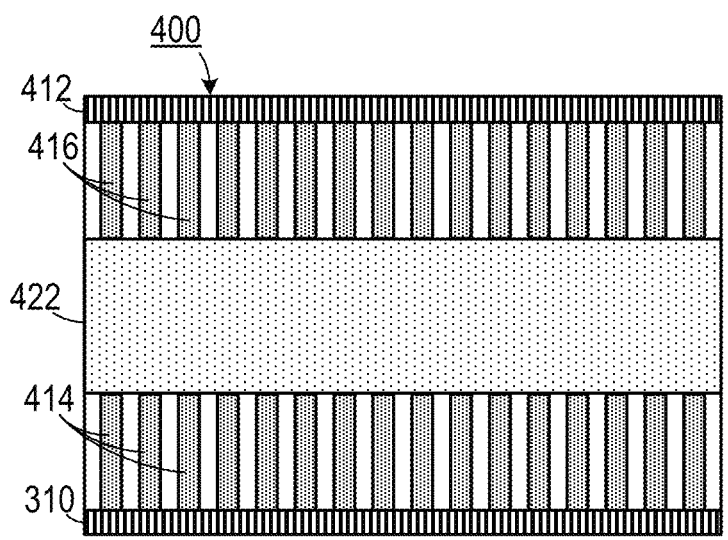

As shown in FIGS. 4A and 4B, one embodiment of a self-charging a super capacitor 400 can include a first conductive surface 410, which can include a metal foam (such as a nickel foam), with a plurality of nanowires 414, such as Co$_3$O$_4$ nanowires (or other nanostructures, such as nanotubes and nanoparticles), extending therefrom. An opposite conductive surface 412, which can include a metal foam, has a plurality of nanowires 416, such as Co$_3$O$_4$ nanowires, extending therefrom. A piezoelectric PVDF and an electrolyte, such as potassium hydroxide (KOH), are disposed between the conductive surfaces 410 and 412 and engage the pluralities of nanowires 414 and 416, thereby acting as a piezoelectric ion transport layer. In one experimental embodiment, Co$_3$O$_4$ nanowires (NWs) arrays grown on two Ni foams act as electrodes. In between the electrodes is disposed a PVDF membrane and the electrolyte of KOH.

The mechanism of the experimental embodiment of the super capacitor type self-charging power pack is explained as follows. When the device undergoes repeated deformation, the piezoelectric PVDF will create piezo-potential (taking the upper portion as positive) along its polarity direction, which is the same as the deformation direction. The ions of K$^+$ and OH$^-$ in the electrode will seperate under the driving of piezo-potential. The K$^+$ ions will be absorbed by the Co$_3$O$_4$ NWs at the lower electrode, while OH$^-$ absorbed at the upper electrode, which will make the lower electrode have a higher potential. When these two electrodes are connected to load to enable discharge (as across a load), the electrons in the upper electrode will flow to the lower electrode in the first moment in order to neutralize the ionic charges as driven by the potential difference created by the ions. Then, the second but slower discharge process is the drift of the K⁺ and OH⁻ across the two electrodes, leading to the flow of electrons in external load.

Essentially, there are two processes that contribute to the charging of the battery, which can be simply stated as follows:

$$I = C\frac{\partial V}{\partial t} + V\frac{\partial C}{\partial t}$$

Where the C is the capacitance of the system and V is the voltage across the two electrodes. The first term in the equation is the charging of the battery component by the dynamic variation of the piezoelectric potential that is being generated by the mechanical deformation of the system when an external force/pressure being applied (e.g. a change in inter-electrode distance D). The second is the change in the capacitance of the system as the distance between the top and bottom electrode being changed when the unit being mechanically deformed. This process contributes to the charging only if there is a potential drop being maintained across the two electrodes. The potential V is applied by the piezoelectric potential. In such a case, the two processes co-existence and promote one by the other. This means that the mechanical energy used to deform the unit can be directly stored as electrochemical energy, and the charging rate and storage capacitance can exceed the performance of a conventional battery.

The above described embodiments, while including the preferred embodiment and the best mode of the invention known to the inventor at the time of filing, are given as illustrative examples only. It will be readily appreciated that many deviations may be made from the specific embodiments disclosed in this specification without departing from the spirit and scope of the invention. Accordingly, the scope of the invention is to be determined by the claims below rather than being limited to the specifically described embodiments above.

What is claimed is:

1. A self-charging energy storage system, comprising:
    (a) a cathode;
    (b) an anode spaced apart from the cathode;
    (c) an electrolyte disposed adjacent to the anode;
    (d) a piezoelectric ion transport layer that includes an aligned polar polymer disposed between the electrolyte the cathode, the piezoelectric ion transport layer having a piezoelectric property that generates a piezoelectric field when a mechanical force is applied thereto, thereby causing transportation of ions in the electrolyte through the piezoelectric ion transport layer towards the anode; and
    (e) a plurality of titanium dioxide nanotubes extending upwardly from the anode into the electrolyte.

2. The self-charging energy storage system of claim 1, wherein a selected one of the cathode and the anode has a surface with a first nano-scale texture and wherein the piezoelectric ion transport layer has a surface with a second nano-scale texture that is complementary to the first nano-scale texture.

3. The self-charging energy storage system of claim 1, wherein the aligned polar polymer comprises PVDF.

4. The self-charging energy storage system of claim 1, wherein the cathode comprises a lithium-containing compound selected from a list consisting of: $LiMn_2O_4$ and $LiCoO_2$.

5. The self-charging energy storage system of claim 3, wherein the cathode further comprises a selected one of a metal foil layer, conductive nanoparticles, conductive nanotubes, or a composite of nanostructures.

6. The self-charging energy storage system of claim 1, wherein the anode comprises a selected one of a metal foil, conductive nanoparticles, conductive nanotubes, or a composite of nanostructures.

7. The self-charging energy storage system of claim 1, wherein the metal foil comprises titanium.

8. The self-charging energy storage system of claim 1, wherein the electrolyte comprises a selected one of $LiPF_6$ and KOH.

9. The self-charging energy storage system of claim 1, wherein the cathode and the anode both comprise a selected one of a metal foil layer, conductive nanoparticles, conductive nanotubes, or a composite of nanostructures.

10. The self-charging energy storage system of claim 1, wherein the cathode and the anode both comprise a nickel foam.

11. The self-charging energy storage system of claim 1, wherein the electrolyte comprises potassium hydroxide disposed in the piezoelectric ion transport layer.

12. The self-charging energy storage system of claim 1, further comprising:
    (a) a first plurality of nanostructures extending from the anode and engaging the piezoelectric ion transport layer; and
    (b) a second plurality of nanostructures extending from the cathode and engaging the piezoelectric ion transport layer.

13. The self-charging energy storage system of claim 12, wherein the nanostructures comprise structures selected from a group of structures consisting of: nanowires, nanotubes and nanoparticles.

14. The self-charging energy storage system of claim 12, wherein the first plurality of nanostructures and the second plurality of nanostructures comprise $Co_3O_4$ nanowires.

* * * * *